United States Patent
Yang et al.

(10) Patent No.: US 12,167,620 B2
(45) Date of Patent: Dec. 10, 2024

(54) DISPLAY PANEL, JIG, AND METHOD OF MANUFACTURING DISPLAY PANEL WITH THE SAME

(71) Applicants: Chengdu BOE Optoelectronics Technology Co., Ltd., Chengdu (CN); BOE Technology Group Co., Ltd., Beijing (CN)

(72) Inventors: Shuquan Yang, Beijing (CN); Kejiang Liu, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 701 days.

(21) Appl. No.: 17/292,441

(22) PCT Filed: Aug. 24, 2020

(86) PCT No.: PCT/CN2020/110826
§ 371 (c)(1),
(2) Date: May 9, 2021

(87) PCT Pub. No.: WO2021/036992
PCT Pub. Date: Mar. 4, 2021

(65) Prior Publication Data
US 2021/0376280 A1 Dec. 2, 2021

(30) Foreign Application Priority Data
Aug. 30, 2019 (CN) .......................... 201910814922.9

(51) Int. Cl.
*H01L 51/52* (2006.01)
*H01L 21/677* (2006.01)
(Continued)

(52) U.S. Cl.
CPC ....... *H10K 50/80* (2023.02); *H01L 21/67775* (2013.01); *H05K 1/028* (2013.01);
(Continued)

(58) Field of Classification Search
CPC .. H05K 1/028; H05K 1/189; H10K 2102/311; H10K 2102/67775; H10K 7/10;
(Continued)

(56) References Cited

U.S. PATENT DOCUMENTS

2014/0345792 A1* 11/2014 Lee ..................... B32B 37/0046
156/228
2017/0255033 A1* 9/2017 Kim ....................... G02F 1/1303
(Continued)

FOREIGN PATENT DOCUMENTS

CN 106023811 A 10/2016
CN 106920830 A 7/2017
(Continued)

OTHER PUBLICATIONS

PCT/CN2020/110826 International Search Report.
CN201910814922.9 First Office Action.

*Primary Examiner* — Jaehwan Oh
*Assistant Examiner* — Lawrence C Tynes, Jr.
(74) *Attorney, Agent, or Firm* — IPro, PLLC

(57) ABSTRACT

A display panel, includes: a display substrate, including a display part and a bent part located on at least one side of the display part, wherein the display part includes a main display portion and a curved display portion located on at least one side of the main display portion, and the main display portion, the curved display portion and the bent part extend continuously; and the bent part is bent with respect to the display part and is disposed on a back side of the display part, the back side is opposite to a display side of the display panel, and an accommodating space is located (Continued)

between the bent part and the curved display portion; and a supporting part, at least partially disposed in the accommodating space and at least partially being in contact with the bent part and the curved display portion, respectively.

7 Claims, 7 Drawing Sheets

(51) Int. Cl.
    *H05K 1/02*     (2006.01)
    *H05K 1/18*     (2006.01)
    *H10K 50/80*     (2023.01)
    *H10K 71/00*     (2023.01)
    *H10K 102/00*     (2023.01)

(52) U.S. Cl.
    CPC .............. *H05K 1/189* (2013.01); *H10K 71/00* (2023.02); *H05K 2201/10128* (2013.01); *H10K 2102/311* (2023.02)

(58) Field of Classification Search
    CPC ........ H10K 59/12; H10K 50/80; H10K 71/00; G09F 9/301
    See application file for complete search history.

(56) References Cited

U.S. PATENT DOCUMENTS

| | | | |
|---|---|---|---|
| 2017/0263492 A1* | 9/2017 | Son | .................... H01L 21/67092 |
| 2018/0006269 A1 | 1/2018 | Tsuda | |
| 2018/0134022 A1* | 5/2018 | Kim | ......................... B32B 38/18 |
| 2018/0199426 A1 | 7/2018 | Lee | |
| 2019/0051847 A1 | 2/2019 | Wang | |
| 2019/0221762 A1 | 7/2019 | Saeki et al. | |
| 2019/0296259 A1* | 9/2019 | Baek | ................... H04M 1/0269 |
| 2019/0333982 A1 | 10/2019 | Choi et al. | |
| 2020/0120792 A1 | 4/2020 | Zhang | |

FOREIGN PATENT DOCUMENTS

| | | | | |
|---|---|---|---|---|
| CN | 107016936 A | * | 8/2017 | ............. G09F 9/301 |
| CN | 107113926 A | | 8/2017 | |
| CN | 107425036 A | | 12/2017 | |
| CN | 108123071 A | | 6/2018 | |
| CN | 108766250 A | | 11/2018 | |
| CN | 109532193 A | | 3/2019 | |
| CN | 109637366 A | | 4/2019 | |
| CN | 208737803 U | | 4/2019 | |
| CN | 109859642 A | | 6/2019 | |
| CN | 110491926 A | | 11/2019 | |

* cited by examiner

S110

S120

DISPLAY PANEL, JIG, AND METHOD OF MANUFACTURING DISPLAY PANEL WITH THE SAME

CROSS REFERENCE TO RELATED APPLICATIONS

This application is a US national phase of a PCT application under PCT/CN2020/110826 which is filed on Aug. 24, 2020, and claims the priority of the Chinese patent application under No. 201910814922.9 entitled "DISPLAY PANEL, JIG, AND METHOD OF MANUFACTURING DISPLAY PANEL WITH THE SAME" and filed on Aug. 30, 2019, the contents of which are incorporated herein by reference in its entirety.

TECHNICAL FIELD

The present disclosure relates to a display panel, a jig and a method of manufacturing a display panel with the same.

BACKGROUND

Organic Light-Emitting Diode (OLED) display device has various advantages, such as being thin, light weight, wide viewing angle, active light emission, continuously adjustable light emission color, low cost, fast response, low energy consumption, low driving voltage, and wide operating temperature range, simple production process, high luminous efficiency and flexible display, and the like, are becoming more and more widely used in display fields such as mobile phones, tablet computers, and digital cameras.

At present, with the continuous development of display technology, flexible display devices have been more and more widely used in various fields such as education, medical care, and entertainment. Flexible OLED display devices with many advantages have become one of the main research trends.

SUMMARY

In a first aspect, the present disclosure provides a display panel including: a display substrate including a display part and a bent part located on at least one side of the display part; wherein the display part includes a main display portion and a curved display portion located at least one side of the main display portion, wherein the main display portion, the curved display portion and the bent part extend continuously, the bent part is bent with respect to the display part and is disposed on a back side of the display part, the back side is opposite to a display side of the display panel, and an accommodating space is located between the bent part and the curved display portion; and a supporting part at least partially disposed in the accommodating space and at least partially being in contact with the bent part and the curved display portion, respectively.

For example, the supporting part comprises a first side surface contacting the curved display portion, the curved display portion comprises a second side surface contacting the supporting part, and a profile of the first side surface is the same as a profile of the second side surface.

For example, both a portion of the supporting part contacting the bent part and a portion of the supporting part contacting the curved display portion have a viscosity.

For example, both the viscosity of the portion of the supporting part contacting the bent part and the viscosity of the portion of the supporting part contacting the curved display portion are not less than 2000 gf/inch.

For example, the supporting part comprises a viscous material so that the portion of the supporting part contacting the bent part and the portion of the supporting part contacting the curved display portion have a viscosity.

For example, at least one portion of the supporting part is in contact with the main display portion.

For example, the supporting part is not in contact with the main display portion.

For example, the display panel further includes a first circuit board, wherein the first circuit board is disposed on the back side of the main display portion, and is configured to be electrically connected to the bent part.

For example, the display panel further includes a flexible circuit board, wherein the flexible circuit board is disposed between the first circuit board and the bent part, and is configured to electrically connect the first circuit board and the bent part.

For example, a portion of the supporting part contacting with the bent part is a flat surface, and a side of the flexible circuit board close to the bent part is bent to make at least one portion of the flexible circuit board disposed on a portion of the supporting part contacting with the bent part.

For example, the display panel is one of an organic light emitting diode display panel and a quantum dot light emitting diode display panel.

In a second aspect, the present disclosure provides a jig, applicable to a display panel, and comprising a carrier, wherein the display panel comprises a display substrate, the display substrate comprises a display part and a bent part located on at least one side of the display part, the display part comprises a main display portion and a curved display portion located on at least one side of the main display portion, and the main display portion, the curved display portion and the bent part extend continuously, wherein the carrier includes: a loading surface, which is concave and configured to receive the display part of the display panel, and comprises a first main surface and a second curved concave surface located on at least one side of the first main surface, wherein the first main surface is configured to receive the main display portion and the second curved concave surface is configured to receive the curved display portion; and a supporting surface, located on at least one side of the loading surface, wherein the supporting surface is configured to support the bent part of the display panel, and the first main surface, the second curved concave surface, and the supporting surface extend continuously.

For example, a plurality of first suction holes are provided on the loading surface, and the plurality of first suction holes are configured to suck the display part of the display panel onto the loading surface.

For example, the carrier includes a main body and a loading part disposed on the main body, the loading part includes the loading surface and the supporting surface, and a plurality of second suction holes are provided on a side of the main body facing the loading part, and the plurality of second suction holes are configured to suck the loading part onto the main body.

For example, the jig further includes a clamp, wherein the display panel further comprises a first circuit board configured to be electrically connected to the bent part, wherein the clamp is configured to pick up the first circuit board of the display panel and to move the first circuit board from a first position to a second position, the first position located on a side of the supporting surface away from the loading surface, and the second position being opposite to the first main surface of the carrier.

For example, the jig further includes a pressing part, wherein the pressing part is configured to press the bent part in a direction perpendicular to the first main surface of the carrier.

In a third aspect, the present disclosure provides method of manufacturing a display panel with the jig as described above, the method includes: placing a display substrate to be bent on the carrier, wherein the display substrate to be bent comprises a display part and a bent part located on at least one side of the display part, and the display part comprises a main display portion and a curved display portion located on at least one side of the main display portion, the main display portion, the curved display portion and the bent part extend continuously, and the display part of the display substrate to be bent is disposed on the loading surface, the main display portion of the display part is in contact with the first main surface, the curved display portion of the display part is in contact with the second curved concave surface, and the bent part of the display substrate to be bent is disposed on the supporting surface; placing the supporting part on the display part of the display substrate to be bent, wherein the supporting part is in contact with the curved display portion; and making the bent part bent to a position above the display part and be at least partially in contact with the supporting part.

For example, the method further includes: providing a first circuit board, and connecting the first circuit board to the bent part of the display substrate to be bent via a flexible circuit board; wherein the jig comprises a clamp and bending the bent part to the position above the display part includes: picking up the first circuit board with the clamp, and moving the clamp with the first circuit board from a first position to a second position, so as to make the bent part bent to the position above the display part following the movement of the clamp through connection of the flexible circuit board, wherein the first position is located on a side of the supporting surface away from the loading surface, and the second position is opposite to the first main surface of the carrier.

For example, the jig further comprises a pressing part, and after making the bent part bent to the position above the display part and be at least partially in contact with the supporting part, the method further includes: placing the pressing part on the bent part, and pressing, by the pressing part, against the bent part in a direction perpendicular to the first main surface, so as to press the bent part, the supporting part and the curved display portion together.

BRIEF DESCRIPTION OF THE DRAWINGS

In order to explain the technical solutions of the embodiments of the present disclosure more clearly, the drawings of the embodiments will be briefly introduced below. Obviously, the drawings in the following description relate to some embodiments of the present disclosure, and cannot be construed as a limit to the present disclosure.

DETAILED DESCRIPTION OF THE EMBODIMENTS

Figure 1A:
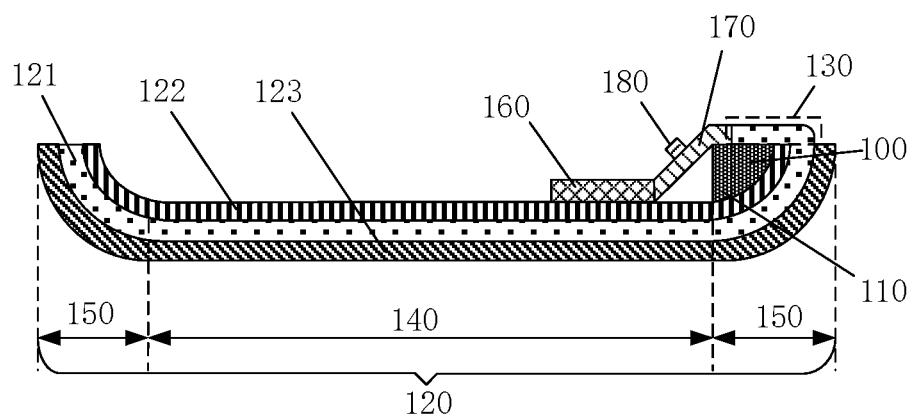
FIG. 1A is a schematic view illustrating a partial structure of a display panel according to some embodiments of the present disclosure.

In order to make the objectives, technical solutions, and advantages of the embodiments of the present disclosure clearer, the technical solutions of the embodiments of the present disclosure will be described clearly and completely in conjunction with the accompanying drawings of the embodiments of the present disclosure. Obviously, the described embodiments are part of the embodiments of the present disclosure, rather than all of the embodiments. Based on the described embodiments of the present disclosure, all other embodiments conceived of by one of ordinary skill in the art without creative labor fall into the protection scope of the present disclosure.

Unless otherwise defined, the technical terms or scientific terms used herein shall have the plain meanings understood by one of ordinary skill in the art to which this disclosure pertains. The "first", "second" and similar words used in the present disclosure do not denote any order, quantity or importance, but are used to distinguish different components. Similarly, similar words such as "a", "one" or "the" do not mean a quantity limit, but rather mean that there is at least one. "Include" or "comprise" and other similar words mean that the element or item appearing before the word covers the elements or items listed after the word and their equivalents, but do not exclude other elements or items.

In this context, the expression "extending continuously" may mean that the parts of the display substrate are continuous, and multiple parts may be integrated. For example, the display substrate may be divided into a display part and a bent part, and the display part and the bent part are connected and extend in the lateral direction of a direction parallel to the display substrate. The expression "extending continuously" may also mean that a plurality of planes are continuous, and are connected to each other.

Herein, the term "display side" means a side of the display panel that displays a picture, or the side viewed by the human eye; and the term "back side" means the other side opposite to the "display side" of the display panel, that is, one side of the display panel does not display a picture.

At present, in order to achieve a design scheme of full-screen display of a flexible display panel, an edge of the flexible display panel is typically designed as an arc-shaped surface, and a portion of a display substrate of the display panel is bent toward a back side of a display part to make the flexible display panel meet the requirements on display at edge. However, after the display substrate is bent, there often lacks of necessary support and fixture between the bent part of the display substrate and a curved display portion at the edge, which makes the edge of the display panel vulnerable to move or dislocate due to external environment influence such as squeezing or impact, thereby causing serious adverse effects on the structure and performance of the display panel. In addition, due to the lack of support between the bent part of the display substrate and the curved display portion at the edge after bending, in a case that the display substrate is bent, it is difficult to determine and fix the bending angle of the display substrate, thereby making it difficult to guarantee bending effect of the display substrate, or even causing a dart occur in a case of bending the display substrate.

At least one embodiment of the present disclosure provides a display panel, which provides stable support to the bent part and/or the curved display portion by providing a supporting part between the bent part of the display substrate and the curved display portion. This avoids or reduces the movement or dislocation of the edges of the display panel, thereby improving the structural stability of the display panel, improving the overall performance of the display panel, and enhancing the full-screen display effect of the display panel.

Hereinafter, some embodiments of the present disclosure will be explained in detail with reference to the accompanying drawings. It should be noted that the same reference numerals in different drawings are used to designate the same elements that have been described.

At least one embodiment of the present disclosure provides a display panel including a display substrate and a supporting part. The display substrate includes a display part and a bent part located on at least one side of the display part. The display part includes a main display portion and a curved display portion located on at least one side of the main display portion. The main display portion, the curved display portion and the bent part extend continuously, the bent part is bent and is disposed on a back side of the display part opposite to a display side of the display panel, and an accommodating space is located between the bent part and the curved display portion; the supporting part is at least partially disposed in the accommodating space located between the bent part and the curved display portion, and contacting the bent part and the curved display portion respectively.

FIG. 1A is a schematic view illustrating a partial structure of a display panel according to some embodiments of the present disclosure. For example, as illustrated in FIG. 1A, the display panel 10 includes a display substrate and a supporting part 110. The display substrate includes a display part 120 and a bent part 130 located on at least one side of the display part 120. The display part 120 includes a main display portion 140 and a curved display portion 150 located on at least one side of the main display portion 140. The main display portion 140, the curved display portion 150 and the bent part 130 extend continuously. The bent part 130 is bent with respect to the display part 120 and is disposed on a back side of the display part 120 opposite to a display side of the display panel 10, and an accommodating space 100 is located between the bent part 130 and the curved display portion 150. The supporting part 110 is at least partially disposed in the accommodating space 100 between the bent part 130 and the curved display portion 150, and at least partially contacts with the bent part 130 and the curved display portion 150, respectively.

In the display panel 10, by arranging the supporting part 110 in the accommodating space 100 between the bent part 130 and the curved display portion 150, the supporting part 110 is brought into contact with the bent part 130 and the curved display portion 150 respectively, such that both the bent part 130 and the curved display portion 150 can be stably supported, avoiding or reducing movement or dislocation between the bent part 130 and the curved display portion 150, thereby improving the structural stability of the display panel 10 and improving the overall performance of the display panel 10, making the display panel 10 achieve a better full-screen display effect.

In the process of manufacturing the display panel 10, and in a case that the display substrate is being bent, since the supporting part 110 can provide stable support for the bent part 130 of the display substrate that is bent to the back side of the display part 120, the display substrate can be prevented from a dart in a case of being bent, thereby increasing the yield of the display panel 10, which is beneficial to the mass production and use of the display panel 10.

In addition, by providing the supporting part 110, a bending angle of the bent part 130 of the display substrate can be controlled and kept fixed, so that the display substrate may be bent at a predetermined angle to achieve a predetermined bending effect. For example, the supporting part 110 has a shape of long strip, and during the process of manufacturing the display panel 10, the display substrate may make a side periphery of the supporting part 110 be bent, so that a bending angle and the bending effect of the display substrate can be kept stable, and thus the manufacturing process of the display panel 10 can be optimized, and the manufacturing accuracy and the yield of the display panel 10 may be improved, thereby facilitating mass production and use of the display panel 10.

It should be noted that in some embodiments of the present disclosure as illustrated in FIG. 1A, a profile of the display panel 10 may be a square, a rectangular or other suitable shapes; or, in some other embodiments of the present disclosure, according to various actual requirements, the display panel 10 may further have other regular or irregular shapes, such as triangles, pentagons, etc., which is not limited in the embodiments of the present disclosure.

It should be noted that in some embodiments of the present disclosure as illustrated in FIG. 1A, the bent part 130 of the display substrate located on one side of the display part 120 is illustrated, while in some other embodiments of the present disclosure, according to the actual profile or various design requirements, the display panel 10 may further include bent parts located on two or more sides of the display part 120. Accordingly, in some embodiments of the present disclosure as illustrated in FIG. 1A, curved display portions 150 of the display substrate located on both sides of the main display portion 140 are illustrated, while in some other embodiments of the present disclosure, instead, the display panel 10 may include a curved display portion located on one side of the main display portion, or multiple curved display portions located on multiple sides of the main display portion, which is not limited in the embodiments of the present disclosures.

For example, as illustrated in FIG. 1A, the supporting part 110 includes a first side surface contacting the curved display portion 150, and the curved display portion 150 includes a second side surface contacting the supporting part 110. The profiles of the first side surface and the second side surface are the same. For example, a profile of a side surface of the supporting part 110 facing the curved display portion 150 is the same as a profile of a side surface of the curved display portion 150 facing the supporting part 110 (i.e., the inner side of the curved display portion 150). As a result, the supporting part 110 and the curved display portion 150 can be better matched together, so that the supporting part 110 can provide a more stable support for the curved display portion 150, thus avoiding or reducing movement, dislocation, deformation, or the like of the curved display portion 150, thereby further improving the stability of the structure of the display panel 10.

For example, in the case where the cross-section of the profile of the curved display portion 150 has a shape of ¼ arc, the supporting part 110 may be designed to have a shape of ¼ cylindrical shape accordingly to achieve better engage with the curved display portion 150. In turn, a more stable support is provided for the curved display portion 150.

For example, in some embodiments of the present disclosure as illustrated in FIG. 1A, a first side surface of the supporting part 110 facing the curved display portion 150 and a second side surface of the curved display portion 150 facing the supporting part 110 are completely engaged, that is, the supporting part 110 contacts each area of a side of the curved display portion 150 facing the supporting part 110 so as to provide uniform and stable support to each portion of the curved display portion 150.

In some other embodiments of the present disclosure, instead, the supporting part may be arranged to be in contact with partial areas of the side surface of the curved display portion facing the supporting part, that is, as long as the supporting part can provide stable support for the curved display portion. The embodiments of the present disclosure do not limit a size of the contact area between the supporting part and the curved display portion. Accordingly, in some other embodiments of the present disclosure, the supporting part can also be in contact with a partial area of the side surface of the bent part facing the supporting part, that is, as long as the supporting part can provide stable support to the bent part. The embodiment of the present disclosure does not limit the size of the contact area between the supporting part and the bent part.

In some embodiments of the present disclosure, as illustrated in FIG. 1A, a portion of the supporting part 110 in contact with the bent part 130 is a plane, and a height of the supporting part 110 (that is, a size of the supporting part 110 in a direction perpendicular to the main display portion 140) is the same as a height of the curved display portion 150 (that is, a size of the curved display portion 150 in a direction perpendicular to the main display portion 140), that is to say, the side surface of the supporting part 110 which contacts with the bent part 130 is flush with an edge of the display portion 150. Thus, in the process of manufacturing the display panel 10, after the bent part 130 is bent along the edge of the curved display portion 150, the bent part 130 can be kept in a stable horizontal state and be engaged completely with a side surface of the supporting part 110 facing the bent part 130, thereby reducing a gap between the bent part 130 and the supporting part 110, and further increasing the contact area between the bent part 130 and the supporting part 110, so that the supporting part 110 provides more stable support for the bent part 130.

In the process of manufacturing the display panel 10, since the display substrate may be bent along the plane of the supporting part 110 away from the supporting part 120 and the bent part 130 of the display substrate can be kept in a horizontal state after bending, an end of bending the display substrate and an bending angle can be accurately controlled, so that the ideal bending effect of the display substrate may be achieved. Therefore, in the process of manufacturing the display panel 10, the supporting part 110 can not only avoid dart or cracking in a case that the display substrate is being bent, but also can optimize the bending process of the display substrate, so as to make the bending angle and the bending effect of the display substrate stable, thereby reducing unnecessary errors that may occur in a case that the display substrate is being bent, and further improving the accuracy and the yield of the manufactured display panel 10.

In addition, since the bent part 130 of the display substrate and the side surface of the supporting part 110 facing the bent part 130 are both on a horizontal plane (that is, in a plane parallel to the main display portion 140) after bending, in a case that the bent part 130, the supporting part 110 and the curved display portion 150 are pressed together, a device for pressing may move vertically in a direction perpendicular to the main display portion 140, thereby facilitating uniformly pressing of the display panel 10 and improving the pressing effect of the display panel 10 so as to further optimizes the manufacturing process of the display panel 10.

For example, in some embodiments of the present disclosure as illustrated in FIG. 1A, a portion where the supporting part 110 contacts the bent part 130 and a portion where the supporting part 110 contacts the curved display part 150 have viscosity. Thus, both the bent part 130 and the curved display portion 150 can be firmly adhered to the supporting part 110, so that the relative position between the bent part 130 and the curved display portion 150 can be kept fixed, thereby further avoiding or reducing movement or dislocation between the bent part 130 and the curved display portion 150, and improving the structural stability of the display panel 10.

For example, viscosities of a portion of the supporting part 110 contacting the bent part 130 and a portion of the supporting part 110 contacting the curved display part 150 can be set to not less than 2000 gf/inch, so that both the bent part 130 and the curved display portion 150 may be firmly adhered to the supporting part 110, thereby avoiding phenomena such as falling off, and further improving the structural stability of the display panel 10.

For example, in some embodiments of the present disclosure, an adhesive layer may be provided on respective side surfaces of the supporting part 110 that contacts the bent part 130 and the curved display portion 150 respectively, so that the bent part 130 and the curved display portion 150 are adhered to the supporting part 110, respectively. Or, in some embodiments of the present disclosure, the supporting part 110 itself may be designed to be made of a viscous material, that is, the supporting part 110 itself is viscous, and the bent part 130 and the curved display portion 150 may be adhered to the supporting part 110, respectively, through the viscosity of the supporting part 110, so as to support and fix the bent part 130 and the curved display portion 150 through the supporting part 110. However, the embodiments of the present disclosure do not limit this.

For example, in a case that the supporting part 110 is made of a viscous material, the supporting part 110 may be made of a soft viscous material such as foam, so as to prevent the display substrate from being squeezed too much by the supporting part 110 in a case that the supporting part 110 is adhered to the display substrate, thereby avoiding damage to the display substrate.

In order to achieve full-screen display of the display panel 10, in some embodiments of the present disclosure, as illustrated in FIG. 1A, the display panel 10 further includes a first circuit board 160 and a flexible circuit board 170. For example, the first circuit board 160 is disposed (for example, fixed to) on the back side of the main display portion 140, the flexible circuit board 170 is disposed between the first circuit board 160 and the bent part 130, and contact pads of the flexible circuit board 170 are respectively bonded to a contact pad of the circuit board 160 and a contact pad of the bent part 130 via, for example, anisotropic conductive glue so as to establish electrical connection, so that the first circuit board 160 is electronically connected to the bent part 130 via the flexible circuit board 170. Thus, the first circuit board 160 and the flexible circuit board 170 are electrically connected to the display part 120 via the bent part 130 to transmit signals to each pixel unit of the display part 120, so that the display panel 10 can realize the display function.

For example, as illustrated in FIG. 1A, the flexible circuit board 170 may be a chip on film (COF) provided with a driving chip 180, and the display panel 10 performs a corresponding display operation according to a driving signal provided by the driving chip 180.

For example, as illustrated in FIG. 1A, in order to make the first circuit board 160 to be completely adhered to the back side of the main display portion 140, the flexible circuit board 170 connecting the first circuit board 160 and the bent part 130 may be bent.

For example, in some embodiments of the present disclosure as illustrated in FIG. 1A, in the case that a portion of the supporting part 110 in contact with the bent part 130 is a plane, a side of the flexible circuit board 170 close to the bent part 130 may be bent, so that at least a portion of the flexible circuit board 170 is located on a portion of the supporting part 110 which contacts the bent part 130, and then in a case that the first circuit board 160 is stably adhered to the back side of the main display portion 140. The bent flexible circuit board 170 may further be supported by the supporting part 110 so as to be kept in a relatively stable state.

It should be noted that, in some embodiments of the present disclosure, the first circuit board 160 may be a rigid circuit board, or may be a flexible circuit board with material similar to that of the flexible circuit board 170, which is not limited in the present disclosure.

For example, in some embodiments of the present disclosure as illustrated in FIG. 1A, the display substrate includes a flexible base substrate. A portion of the flexible base substrate located in the display area of the display panel 10 is provided with a plurality of pixel units arranged in an array, and the portion of the flexible base substrate and the plurality of pixel units arranged on the portion of the flexible base substrate are configured as a display device structure layer 121 of the display part 120, so that a display function of the display panel 10 is achieved. For example, a portion of the flexible base substrate outside the display area of the display panel 10 is bent toward the back side of the display part 120 to form the bent part 130.

For example, as illustrated in FIG. 1A, the display device structure layer 121 is located in the display area of the display panel 10. Each pixel unit in the display device structure layer 121 may include a light-emitting element, a pixel circuit, etc., and the pixel circuit includes, for example, a thin film transistor (TFT), and the light emitting element includes, for example, an organic light emitting diode (OLED) or a quantum dot light emitting diode (QLED). For example, a thin film transistor includes an active layer, a gate, a source and a drain; an organic light emitting diode includes driving electrodes and a light emitting layer disposed between the driving electrodes. For example, the display device structure layer 121 further includes a plurality of insulating layers disposed between the respective electrode layers of the thin film transistor and the organic light emitting diode. For example, the plurality of insulating layers may include a buffer layer, a gate insulating layer, an interlayer dielectric layer, and a planarization layer, a pixel definition layer, and the like. The structure of the pixel unit in the display device structure layer 121 is not limited in the embodiments of the present disclosure.

Figure 1B:
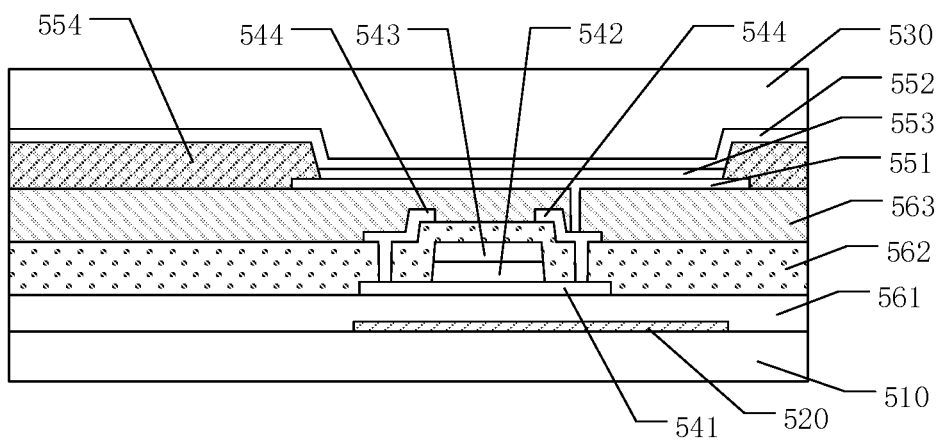
FIG. 1B illustrates a partial view of an exemplary display device structure layer of the display panel in FIG. 1A.
Figure 1C:
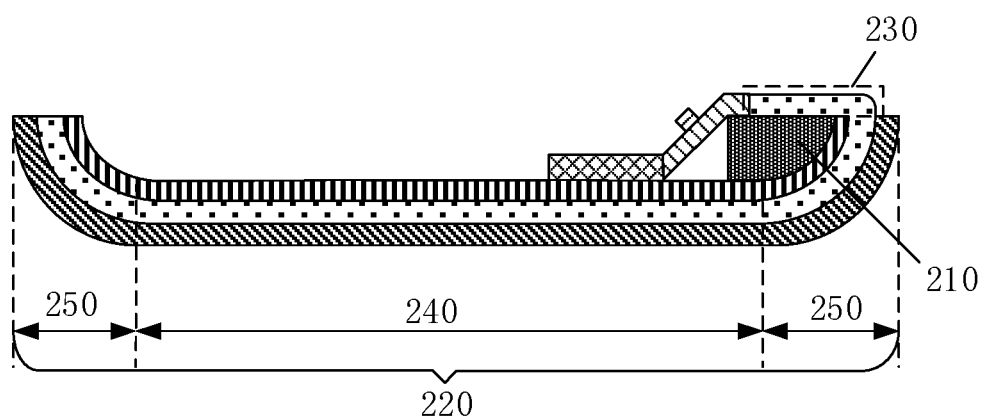
FIG. 1C is a schematic view illustrating a partial structure of another display panel according to some embodiments of the present disclosure.

FIG. 1B illustrates a partial view of an exemplary display device structure layer of the display panel in FIG. 1A. As illustrated in FIG. 1B, the display device structure layer 121 includes a flexible base substrate 510, a light shielding portion 520, a thin film transistor, an organic light emitting diode, and an encapsulation layer 530. The thin film transistor includes an active layer 541, a gate 543, and source/drain 544. The organic light emitting diode includes a first driving electrode 551, a second driving electrode 552, and a light emitting layer 553 between the first driving electrode 551 and the second driving electrode 552. A plurality of insulating layers are disposed between the respective electrode layers. The plurality of insulating layers may include a buffer layer 561, a gate insulating layer 542, an interlayer dielectric layer 562, a planarization layer 563, a pixel definition layer 554, and the like. For example, the display device structure layer 121 as illustrated in FIG. 1C may be configured for an OLED display panel. In some other embodiments of the present disclosure, the display device structure layer 121 may further include additional structures, which are not limited in the embodiments of the present disclosure.

In some embodiments of the present disclosure, as illustrated in FIG. 1A, the structure of the display part 120 of the display substrate may further include, for example, a protective layer 123 and a heat dissipation layer 122 stacked on the display device structure layer 121. The protective layer 123 is located at the display side of the display device structure layer 121 to protect the display device structure layer 121 and other devices or functional layers of the display panel 10. For example, the material of the protective layer 123 may be an inorganic material such as glass or an organic material such as polyimide. The heat dissipation layer 122 is disposed on the back side of the display device structure layer 121 to dissipate the heat generated by the display substrate during display. For example, material for the heat dissipation layer 122 may be a metal material with good heat dissipation effect and ductility.

For example, in some other embodiments of the present disclosure, the structure of the display part 120 may further include, for example, a touch electrode layer, a polarizing layer, or other suitable structural layers or functional layers, which are not limited in the embodiments of the present disclosure. It should be noted that the structure and arrangement of, for example, the heat dissipation layer 122, the protective layer 123 or other functional layers are not limited in the embodiments of the present disclosure.

It should be noted that the embodiments of the present disclosure describe some of the structures of the display panel 10, and the display panel 10 according to the embodiments of the present disclosure may further include other required structures or devices, which is not limited by the embodiments of the present disclosure.

In some other embodiments of the present disclosure, the supporting part may further be in contact with the main display portion.

For example, on the basis of the embodiment as illustrated in FIG. 1A, as illustrated in FIG. 1C, at least one portion of the supporting part 210 of the display panel 20 is in contact with the main display portion 240, thereby increasing contact area between the supporting part 210 and the display part 220. Therefore, in the case that the supporting part 210 is further configured to support the main display portion 240, the supporting part 210 may further configured to provide more stable support to the bent part 230 and the curved display portion 250, thereby more effectively avoiding or reducing movement and dislocation between the bent part 230 and the curved display portion 250, which significantly improves the structural stability of the display panel 20.

It should be noted that the other structures and functions of the display panel 20 illustrated in FIG. 1C except for the portion of the supporting part 210 contacting the main display portion 240 are substantially the same as those of the display panel 10 as illustrated in FIG. 1A, and will not be elaborated here.

For example, in some embodiments of the present disclosure as illustrated in FIGS. 1A and 1C, the display panel 10 and the display panel 20 may be organic light-emitting diode display panels or quantum dot light-emitting diode display panels, or may also be other types of flexible panels with display functional, which is not limited in the embodiments of the present disclosure.

For example, the display panel 10 and the display panel 20 may be electronic paper, OLED panels, QLED panels, mobile phones, tablet computers, televisions, monitors, laptops, digital photo frames, navigators and other products or components with display functions, which is not limited in the embodiments of the present disclosure.

At least one embodiment of the present disclosure further provides a jig applicable to a display panel, and the jig includes a carrier. The carrier includes a loading surface which is concave and a supporting surface located on at least one side of the loading surface; a display substrate of the display panel includes a display part and a bent part located on at least one side of the display part. The display part includes a main display portion and a curved display portion located on at least one side of the main display portion. The curved display portion is in contact with the main display portion and the bent part, respectively. The loading surface of the carrier is configured to receive the display part of the display panel. The loading surface includes a first main surface and a second curved concave surface located on at least one side of the first main surface. The first main surface is configured to receive the main display portion of the display panel. The second curved concave surface is configured to receive the curved display portion of the display panel, the supporting surface is configured to support the bent part of the display panel, and the first main surface, the second curved concave surface and the supporting surface extend continuously.

In the jig for the display panel according to at least one embodiment of the present disclosure, the carrier of the jig is, for example, grooved, and the loading surface of the carrier includes a first main surface and a second curved concave surface, such that the loading surface is matched with the profile of the display panel, for example, the second curved concave surface matches the arc-shaped edge of the display panel, so that the display part of the display panel can be stably received in the carrier. Thus, for example, during the manufacturing process of the display panel, the display substrate of the display panel can be placed on the carrier stably, so that the carrier can provide stable support and fixation to the display substrate, thereby avoiding or reducing movement or dislocation of the display substrate in the manufacturing process, improving the stability and accuracy of the manufacturing process of the display panel, and improving the manufacturing yield of the display panel.

For example, in a case that the jig according to the above-mentioned embodiments of the present disclosure is configured to bend the display substrate to be bent, the loading surface of the carrier may provide stable support to the display part of the display substrate, thereby effectively avoiding or reducing movement or dislocation of the display substrate during bending, thereby improving the bending effect of the display substrate, and improving the accuracy and stability of bending the display substrate. As a result, the stability and accuracy of the manufacturing process of the display panel can be improved significantly, thereby optimizing the manufacturing process of the display panel and improving the manufacturing yield of the display panel.

Figure 2:
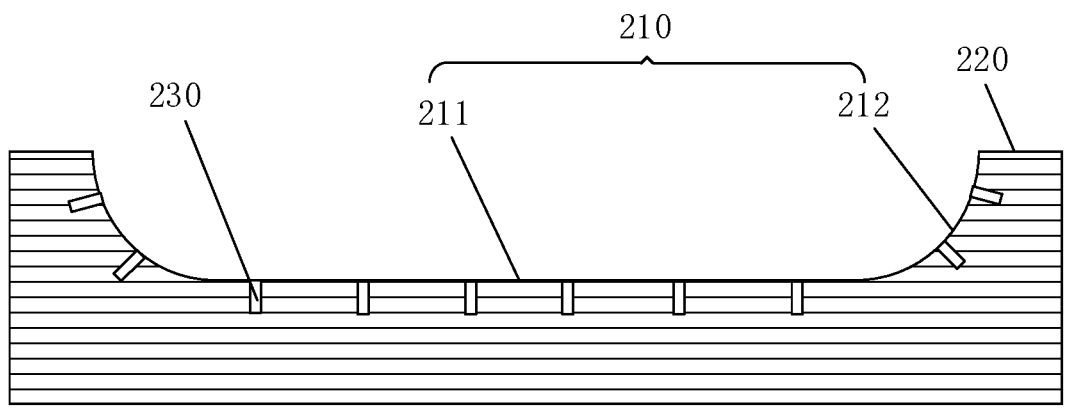
FIG. 2 is a schematic structural view illustrating a carrier for a jig for a display panel according to some embodiments of the present disclosure.

FIG. 2 is a schematic structural view illustrating a carrier of a jig for a display panel according to some embodiments of the present disclosure. For example, as illustrated in FIG. 2, the carrier 200 includes a loading surface 210 which is concave and a supporting surface 220 disposed on at least one side of the loading surface 210.

For example, the loading surface 210 may be configured to receive a display part of a display panel, for example, it may be configured to receive the display part 120 of the display panel 10 as illustrated in FIG. 1A. The loading surface 210 includes a first main surface 211 and a second curved concave surface 212 located on at least one side of the first main surface 211. The first main surface 211 is configured to receive a main display portion, for example, it can be configured to receive the main display portion 140 of the display panel 10 as illustrated in FIG. 1A. The second curved concave surface 212 is configured to receive a curved display portion, for example, the curved display surface 150 of the display panel 10 as illustrated in FIG. 1A. Therefore, the display part of the display substrate can be stably received in the carrier 200 due to the concave design of the loading surface 210, so that the carrier 200 can provide stable support to the display part of the display panel during the process of making or manufacturing the display panel, thereby provide a stable manufacturing environment for the display panel.

For example, the supporting surface 220 is configured to support the bent part of the display panel to be bent to the back side of the display part, for example, it may be configured to support the bent part 130 of the display panel 10 as illustrated in FIG. 1A. The first main surface 211, the second curved concave surface 212, and the supporting surface 220 extend continuously. Therefore, during the process of making or manufacturing the display panel, the supporting surface 220 can provide stable support for the bent part of the display substrate, thereby providing a stable processing environment for the display panel.

In addition, in the process of manufacturing the display panel with the jig according to the embodiment of the present disclosure, for example, in a case that the display substrate of the display panel is bent, the supporting surface 220 can make the bent part of the display substrate in a horizontal state stably, and then a component such as a circuit board (for example, the first circuit board 160 and the flexible circuit board 170 as illustrated in FIG. 1A) connected to the bent part can also be maintained on a stable horizontal surface, so that the circuit board can be accurately picked up to facilitate subsequent operations such as bending.

It should be noted that, in the carrier 200 as illustrated in FIG. 2, the carrier 200 includes a supporting surface 220 located on both sides of the loading surface 210, and the loading surface 210 includes a second curved concave surface 212 located on both sides of the first body surface 211. In some other embodiments of the present disclosure, the carrier of the jig can further be designed into other suitable structures according to various actual requirements, for example, according to the profile of the manufactured display panel or requirements on the processes, which is not limited in the embodiments of the present disclosure.

For example, as illustrated in FIG. 2, a plurality of first suction holes 230 are provided on the loading surface 210 of the carrier 200, and the plurality of first suction holes 230 are configured to suck the display part of the display panel onto the loading surface 210. For example, the plurality of first suction holes 230 may be configured to make the display part 120 of the display panel 10 as illustrated in FIG. 1A be sucked onto the loading surface 210, and then in a case of processing the display panel with the jig having the carrier 200, the display part of the display panel can be firmly fixed on the loading surface 210, thereby providing a stable processing environment for the display panel, improving the precision and accuracy of the manufacturing process of the display panel, and further improving the yield of the manufactured display panel.

For example, in some embodiments of the present disclosure, a suction channel may further be provided in the carrier 200, and the suction channel is communicated with the plurality of first suction holes 230. For example, one end of the suction channel is communicated with the plurality of first suction holes 230, and another end of the suction channel is communicated with an air extractor (such as an air pump), so that the first suction hole 230 can produce suction, and the display part of the display substrate may be firmly fixed on the loading surface 210 of the carrier 200. It should be noted that in some other embodiments of the present disclosure, the first suction holes 230 may generate suction in other ways, which is not limited in the embodiments of the present disclosure.

It should be noted that the number of the first adsorption holes 230 is not limited in the embodiments of the present disclosure, as long as the display part of the display panel can be stably sucked onto the loading surface 210 of the carrier 200. For example, because the second curved concave surface 212 is designed to be curved, in order to ensure that the curved display portion of the display panel can be firmly sucked onto the second curved concave surface 212, a density of the first suction holes 230 provided on the second curved concave surface 212 can be slightly greater than a density of the first suction holes 230 provided on the first main surface 211, which is not limited in the embodiment of the present disclosure.

Figure 3:
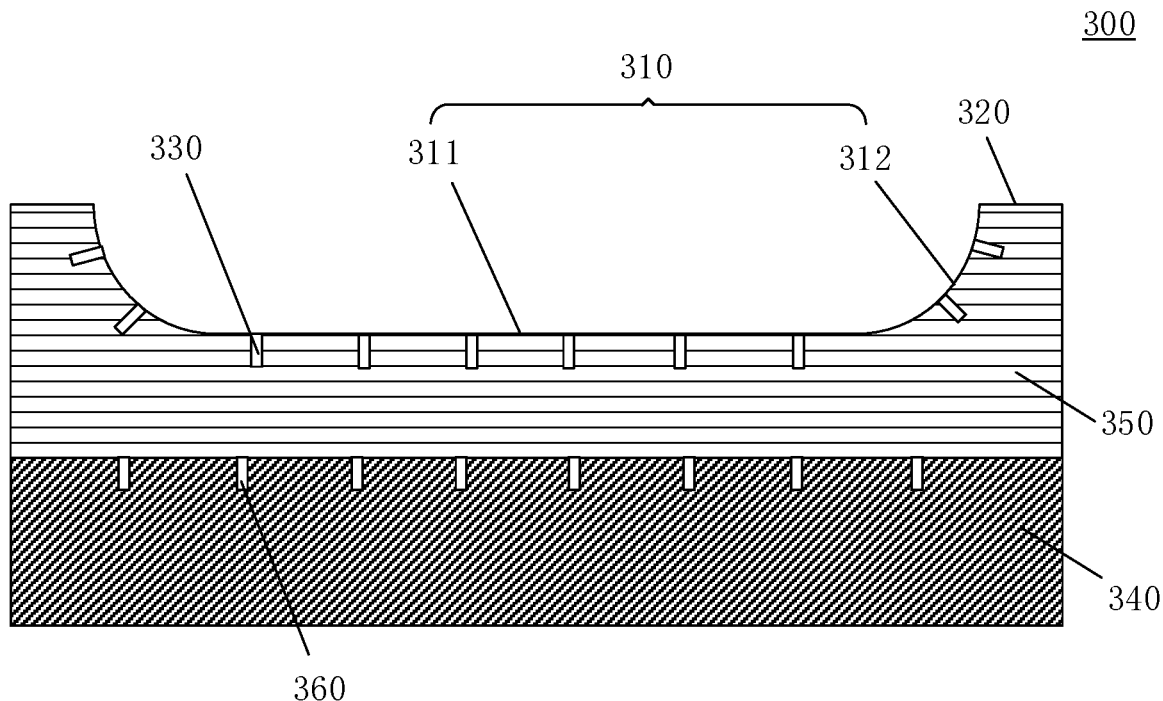
FIG. 3 is a schematic structural view illustrating another carrier for a jig for a display panel according to some embodiments of the present disclosure.

FIG. 3 is a schematic structural view illustrating another carrier of a jig for a display panel according to some embodiments of the present disclosure.

For example, as illustrated in FIG. 3, a carrier 300 includes a main body 340 and a loading part 350 disposed on the main body 340. The loading part 350 includes a loading surface 310 and a supporting surface 320. The loading surface 310 includes a first main surface 311 and a second curved concave surface 312 located on both sides of the first main surface 311. A plurality of second suction holes 360 are provided on a surface of the main body 340 facing the loading part 350, and the plurality of second suction holes 360 are configured to suck the loading part 350 onto the main body 340. It should be noted that the loading surface 310 and the supporting surface 320 of the carrier 300 as illustrated in FIG. 3 are substantially the same as the loading surface 210 and the supporting surface 220 of the carrier 200 as illustrated in FIG. 2, and will not be elaborated here.

For example, in a case that the display panel is made or manufactured with the jig including the carrier 300, according to the different profiles of the display panel, it is necessary to process the loading surface 310 of the loading part 350 of the carrier 300 so as to make the loading surface 310 match the profile of the display panel, without changing the structure of the main body 340. As a result, the main body 340 of the carrier 300 can be reused, thereby reducing the cost of the carrier 300, and further reducing the manufacturing cost of the jig including the carrier 300, so that the jig can be widely used.

For example, the jig according to some embodiments of the present disclosure further includes a clamp, which is configured to pick up a circuit board of the display panel and is configured to move the circuit board from a first position to a second position. The first position is located on a side of the supporting surface away from the loading surface, the second position faces the first main surface of the carrier, for example, the circuit board can be moved from a lateral side of the carrier to a longitudinal side of the carrier. For example, in a case that the jig according to the embodiments of the present disclosure is configured for the display panel 10 as illustrated in FIG. 1A, the first circuit board 160 of the display panel 10 may be picked up by the jig, and then the first circuit board 160 is mounted onto a back side of the display part 120, for example, mounted onto a back side of the main display portion 140.

For example, the jig according to some embodiments of the present disclosure further includes a pressing part, which is disposed to be close to the bent part in a direction perpendicular to the first main surface of the carrier, so as to perform pressing operation. For example, in a case that the jig according to the embodiment of the present disclosure is configured for the display panel 10 as illustrated in FIG. 1A, the pressing part can be configured to press the bent part 130 in a direction perpendicular to the first main surface of the carrier, so as to press the curved display portion 150, the supporting part 110, and the bent part 130 together.

It should be noted that the jig according to the embodiment of the present disclosure may further include other components or functional parts, which is not limited in the embodiment of the present disclosure.

Hereinafter, taking the jig according to the embodiments of the present disclosure configured to manufacture a display panel as an example, the method of using the jig according to the embodiment of the present disclosure will be described.

At least one embodiment of the present disclosure further provides a method of manufacturing a display panel by using the jig according to any one of the embodiments of the present disclosure, including: placing a display substrate to be bent on the carrier, wherein the display substrate to be bent includes a display part and a bent part located on at least one side of the display part, the display part includes a main display portion and a curved display portion located on at least one side of the main display portion, the main display portion, the curved display portion and the bent part extend continuously, the display part of the display substrate to be bent is located on the loading surface, the main display portion of the display part is in contact with the first body surface, the curved display portion of the display part is in contact with the second curved concave surface, and the bent part of the display substrate to be bent is located on the supporting surface; placing the supporting part on the display part of the display substrate to be bent, wherein the supporting part is in contact with the curved display portion; and bending the bent part to a position above the display part and making the bent part at least partly in contact with the supporting part.

Figure 4:
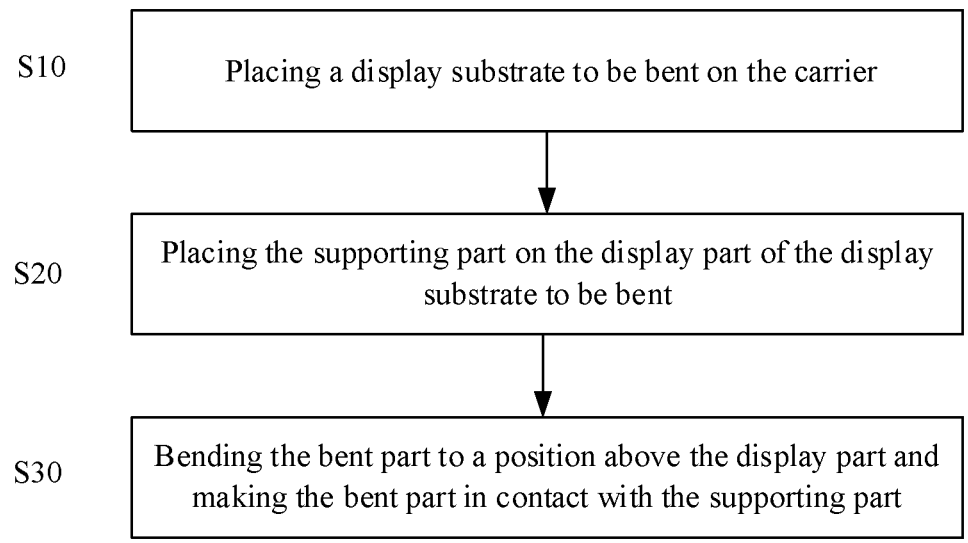
FIG. 4 is a flowchart illustrating a method of manufacturing a display panel according to some embodiments of the present disclosure with the jig according to the embodiments of the present disclosure.

FIG. 4 illustrates a flowchart of a method of manufacturing a display panel according to the embodiments of the present disclosure with the jig according to some embodiments of the present disclosure. For example, the method includes the following steps.

Step S10: Placing a display substrate to be bent on the carrier.

Step S20: Placing the supporting part on the display part of the display substrate to be bent.

Step S30: Bending the bent part to a position above the display part and making the bent part in contact with the supporting part.

The method of manufacturing the display substrate according to the embodiments of the present disclosure will be described in connection with FIGS. 5A-5F by taking manufacturing the display panel 10 as illustrated in FIG. 1A with the jig including the carrier 200 as illustrated in FIG. 2 as an example. For example, the method includes the following steps.

Step S110: Placing the display substrate to be bent on the carrier 200.

Figure 5A:
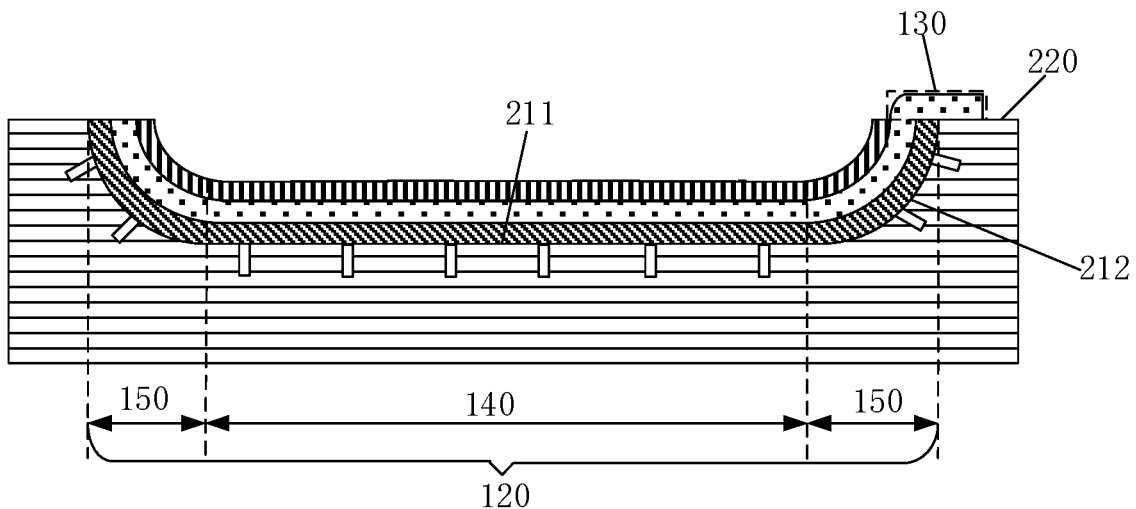
FIG. 5A-5F are schematic views of steps illustrating an example of a method for manufacturing a display panel according to some embodiments of the present disclosure through a jig according to an embodiment of the present disclosure.

For example, as illustrated in FIG. 5A, the display part 120 of the display substrate to be bent is located on the loading surface 210, the main display portion 140 of the display part 120 is in contact with the first main surface 211, and the curved display portion 150 of the display part 120 is in contact with the second curved concave surface 212. The bent part 130 of the display substrate to be bent is located on the supporting surface 220.

Step S120: Providing a first circuit board 160, and connecting the first circuit board 160 to the bent part 130 of the display substrate to be bent via a flexible circuit board 170.

Figure 5B:
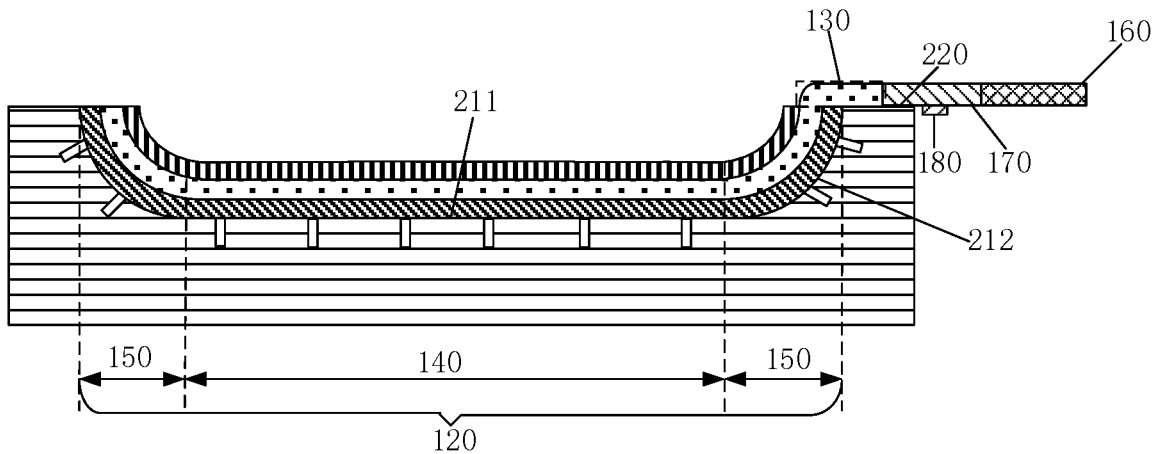

For example, as illustrated in FIG. 5B, contact pads of the flexible circuit board 170 are bonded to a contact pad of the first circuit board 160 and a contact pad of the bent part 130, respectively, via for example anisotropic conductive glue, so as to establish electrical connection, and then the first circuit board 160 is connected to the bent part 130 of the display substrate to be bent through the flexible circuit board 170. It should be noted that when the bent part 130, the flexible circuit board 170, and the first circuit board 160 are connected to each other, the flexible circuit board 170 may be located above the bent part 130, and the first circuit board 160 may be located above the flexible circuit board 170; or, the flexible circuit board 170 may be located above the bent part 130, and the first circuit board 160 may be located below the flexible circuit board 170. The connection manner is not limited in the embodiments of the present disclosure.

Figure 6A:
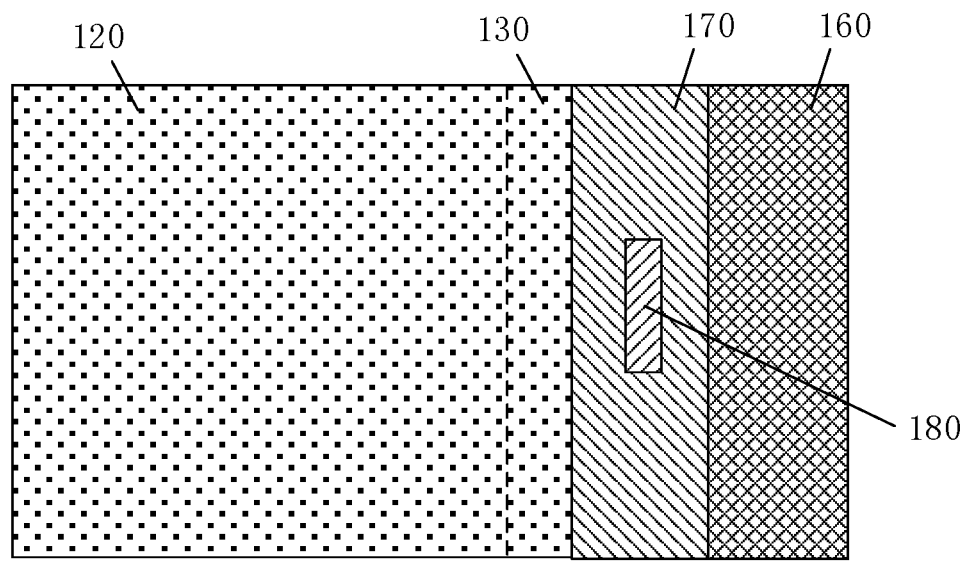
FIG. 6A is a schematic view illustrating a planar structure of the display substrate to be bent as illustrated in FIG. 5B.

For example, in conjunction with FIG. 5B and FIG. 6A, the display part 120, the bent part 130, the flexible circuit board 170, and the first circuit board 160 are electrically connected to each other, and the driving chip 180 of the flexible circuit board 170 can be configured to supply, for example, driving signals for display so as to drive the display part 120 to perform a corresponding display operation, so that the display panel 10 realizes a display function.

Step S130: Placing the supporting part 110 on the display part 120 of the display substrate to be bent.

Figure 5C:
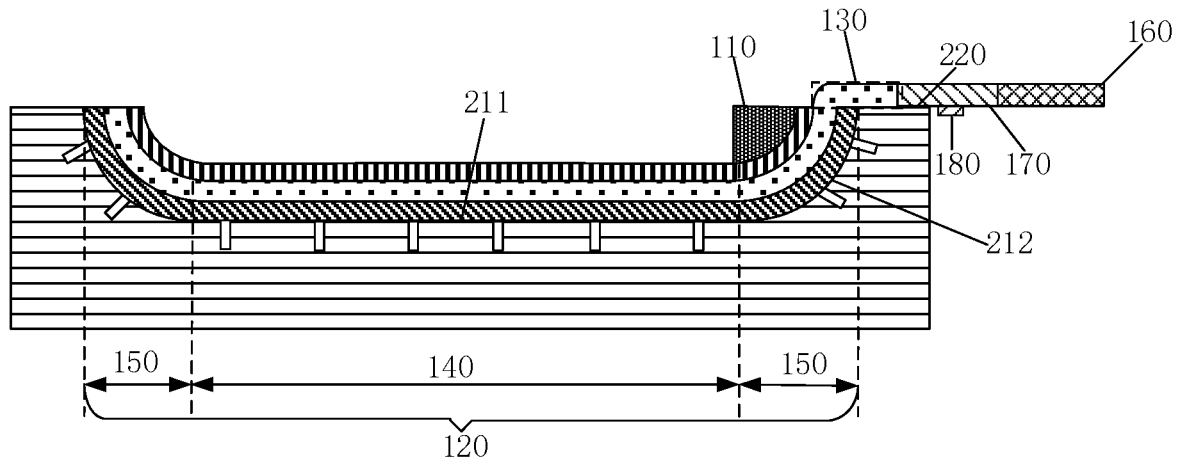
Figure 6B:
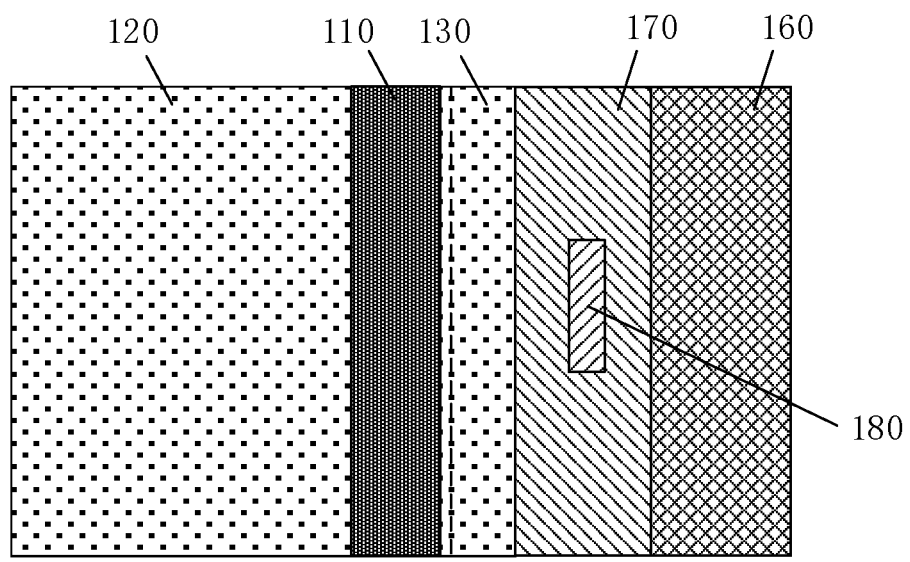
FIG. 6B is a schematic view illustrating the planar structure of the display substrate to be bent as illustrated in FIG. 5C and the supporting part.

For example, as illustrated in FIG. 5C and FIG. 6B, the supporting part 110 is placed on the display part 120 of the display substrate to be bent, and the supporting part 110 is brought into contact with the curved display portion 150. Thus, after the bent part 130 is bent to a position above the display part 120 of the display substrate, the bent part 130 may at least partially contact the supporting part 110.

Step S140: Picking up the first circuit board 160 with the clamp 410, and making the clamp 410 move the first circuit board 160 from a side of the supporting surface 220 away from the loading surface 210 to the first main surface 211 of the carrier 200, for example, from a lateral side of the carrier 200 to a longitudinal side of the carrier 200, so that the bent part 130 is bent to a position above the display part 120 by following the movement of the clamp through connection of the flexible circuit board 170.

Figure 5D:
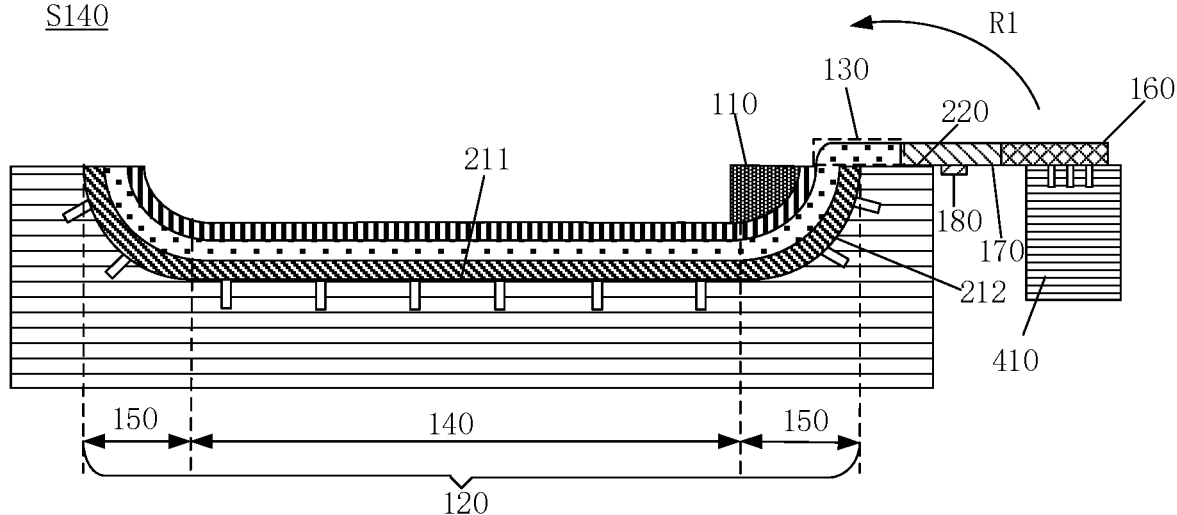
Figure 5E:
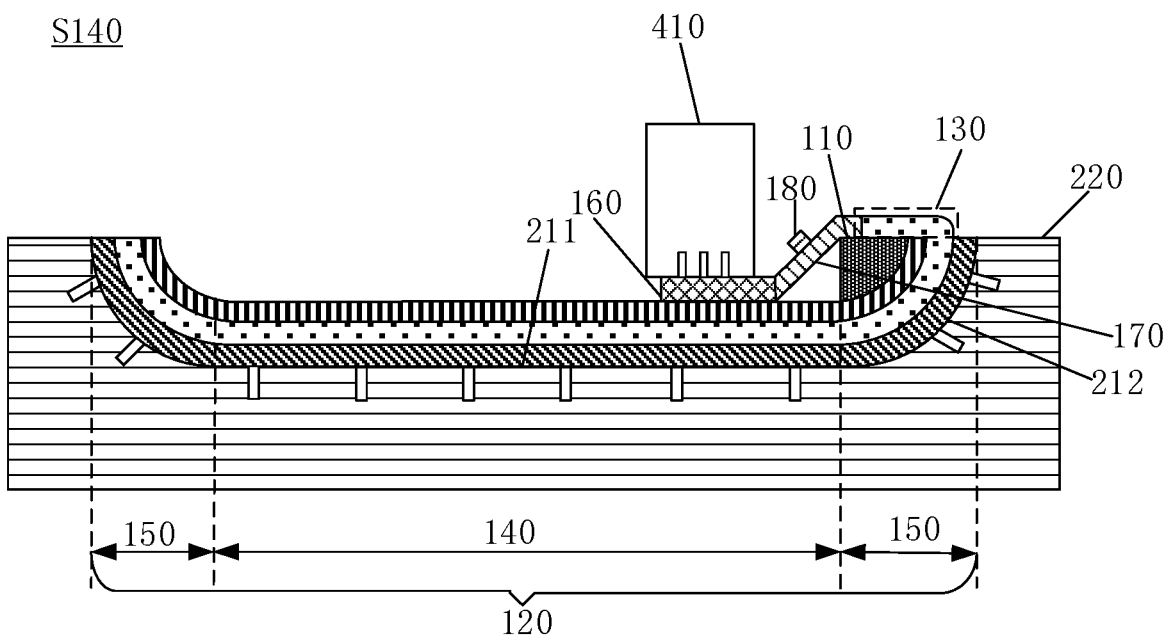

For example, as illustrated in FIG. 5D and FIG. 5E, the clamp 410 can move the first circuit board 160 along the curve R1 from a side of the supporting surface 220 away from the loading surface 210 to a first main surface 211 of the carrier 200, for example from a lateral side of the carrier 200 moves to a longitudinal side of the carrier 200, so as to bend the bent part 130 toward a back side of the display part 120.

For example, as illustrated in FIG. 5E, the bent part 130 may be bent along an edge of the supporting part 110 so as to at least partially contact the supporting part 110.

For example, as illustrated in FIG. 5E, a portion of the supporting part 130 contacting the bent part 130 is a plane, and the flexible circuit board 170 can be bent along an edge of the supporting part 110 away from the curved display portion 150, so that the first circuit board 160 is attached to the back side of the main display portion 140.

Step S150: Placing the pressing part 420 on the bent part 130 to press the bent part 130, the supporting part 110 and the curved display portion 150 against the loading surface 210.

Figure 5F:
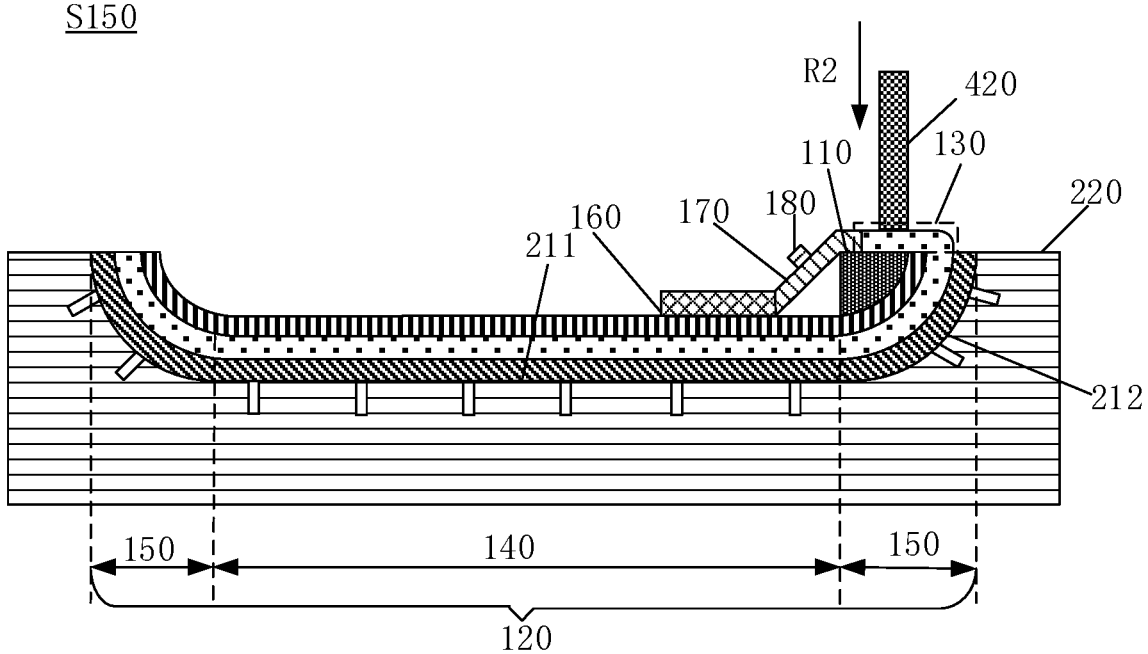

For example, as illustrated in FIG. 5F, the pressing portion 420 abuts against the bent part 130 along the direction of the straight line R2 to press the bent part 130, the supporting part 110, and the curved display portion 150, so that the bent part 130, the supporting part 110 and the curved display portion 150 can be better attached to each other, in this way, the supporting part 110 provides a more stable support for the bent part 130 and the curved display portion 150.

The method of manufacturing the display panel according to the embodiments of the present disclosure can provide stable support for the display substrate in a case that the display substrate is bent, and enable the display substrate to be bent according to a predetermined bending angle, thereby improving the bending effect of the display substrate. In addition, the accuracy and stability of the manufacturing process of the display panel are improved, and the yield of the manufacturing display panel is improved.

The drawings of the embodiments of the present disclosure relate to the structures involved in the embodiments of the present disclosure, and other structures can be referred to common designs.

For the sake of clarity, in the drawings used to describe the embodiments of the present disclosure, the thicknesses of layers or regions are enlarged or reduced, that is, these drawings are not drawn according to actual scale. It should be noted that, in a case that an element such as a layer, film, region, or substrate is referred to as being "on" or "under" another element, the element can be "directly" on or "under" the other element, or there may be intermediate elements.

In the case of no conflict, the embodiments of the present disclosure and the features in the embodiments can be combined with each other to obtain new embodiments.

The above are the embodiments of the present disclosure, but the protection scope of the present disclosure is not limited thereto. One of ordinary skill in the art can easily conceive of changes or substitutions within the technical scope disclosed in the present disclosure, which shall fall within the protection scope of this disclosure. Therefore, the protection scope of the present disclosure should be defined by the claims.

The invention claimed is:

1. A jig, applicable to a display panel, and comprising a carrier, wherein the display panel comprises a display substrate, the display substrate comprises a display part and a bent part located on at least one side of the display part, the display part comprises a main display portion and a curved display portion located on at least one side of the main display portion, and the main display portion, the curved display portion and the bent part extend continuously, wherein, the carrier comprises:

a loading surface, which is concave and configured to accommodate the display part of the display panel, and comprises a first main surface and a second curved concave surface located on at least one side of the first main surface, wherein the first main surface is configured to accommodate the main display portion and the second curved concave surface is configured to accommodate the curved display portion;

a supporting surface, located on at least one side of the load surface, wherein the supporting surface is configured to support the bent part of the display panel, and the first main surface, the second curved concave surface, and the supporting surface extend continuously; and a main body and a loading part disposed on the main body, wherein the loading part comprises the loading surface and the supporting surface, and a plurality of second suction holes are provided on a side of the main body facing the loading part, and the plurality of second suction holes are configured to suck the loading part onto the main body.

2. The jig according to claim 1, wherein a plurality of first suction holes are provided on the loading surface, and the plurality of first suction holes are configured to suck the display part of the display panel onto the loading surface.

3. The jig according to claim 1, further comprising a clamp, wherein the display panel further comprises a first circuit board configured to be electrically connected to the bent part; and wherein the clamp is configured to pick up the first circuit board of the display panel and to move the first circuit board from a first position to a second position, the first position located on a side of the supporting surface away from the loading surface, and the second position being opposite to the first main surface of the carrier.

4. The jig according to claim 1, further comprising a pressing part, wherein the pressing part is configured to press the bent part in a direction perpendicular to the first main surface of the carrier.

5. A method of manufacturing a display panel with the jig according to claim 1, comprising:

placing a display substrate to be bent on the carrier, wherein the display substrate to be bent comprises a display part and a bent part located on at least one side of the display part, and the display part comprises a main display portion and a curved display portion located on at least one side of the main display portion, the main display portion, the curved display portion and the bent part extend continuously, and the display part of the display substrate to be bent is disposed on the loading surface, the main display portion of the display part is in contact with the first main surface, the curved display portion of the display part is in contact with the second curved concave surface, and the bent part of the display substrate to be bent is disposed on the supporting surface;

placing the supporting part on the display part of the display substrate to be bent, wherein the supporting part is in contact with the curved display portion; and making the bent part bent to a position above the display part and be at least partially in contact with the supporting part.

6. The method according to claim 5, further comprising:

providing a first circuit board, and connecting the first circuit board to the bent part of the display substrate to be bent via a flexible circuit board;

wherein the jig comprises a clamp and bending the bent part to the position above the display part comprises:

picking up the first circuit board with the clamp, and moving the clamp with the first circuit board from a first position to a second position, so as to make the bent part bent to the position above the display part following the movement of the clamp through connection of the flexible circuit board, wherein the first position is located on a side of the supporting surface away from the loading surface, and the second position is opposite to the first main surface of the carrier.

7. The method according to claim 5, wherein the jig further comprises a pressing part, and after making the bent part bent to the position above the display part and be at least partially in contact with the supporting part, the method further comprises:

placing the pressing part on the bent part, and pressing, by the pressing part, against the bent part in a direction perpendicular to the first main surface, so as to press the bent part, the supporting part and the curved display portion together.

* * * * *